(12) United States Patent
Morales et al.

(10) Patent No.: US 9,709,642 B2
(45) Date of Patent: Jul. 18, 2017

(54) ISOTROPIC AND INTEGRATED OPTICAL PUMPING MAGNETOMETER

(71) Applicant: COMMISSARIAT A L'ENERGIE ATOMIQUE ET AUX ENE ALT, Paris (FR)

(72) Inventors: Sophie Morales, Varces (FR); Laurence Clerc, Brie et Angonnes (FR); William Fourcault, Grenoble (FR); Matthieu Le Prado, Saint Marcellin (FR); Jean-Michel Leger, Villard Bonnot (FR); Umberto Rossini, Coublevie (FR); Jaroslaw Rutkowski, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 546 days.

(21) Appl. No.: 14/362,501

(22) PCT Filed: Dec. 13, 2012

(86) PCT No.: PCT/EP2012/075426
§ 371 (c)(1),
(2) Date: Jun. 3, 2014

(87) PCT Pub. No.: WO2013/092383
PCT Pub. Date: Jun. 27, 2013

(65) Prior Publication Data
US 2014/0368193 A1    Dec. 18, 2014

(30) Foreign Application Priority Data
Dec. 19, 2011   (FR) .................................. 11 61946

(51) Int. Cl.
*G01V 3/00* (2006.01)
*G01R 33/26* (2006.01)
*G02F 1/13363* (2006.01)

(52) U.S. Cl.
CPC .. *G01R 33/26* (2013.01); *G02F 2001/133638* (2013.01)

(58) Field of Classification Search
CPC ................... G01R 33/26; G02F 2001/133638
(Continued)

(56) References Cited

U.S. PATENT DOCUMENTS 3,513,381 A * 5/1970 Happer, Jr. ............ G01R 33/26
                                                        324/304
3,584,292 A * 6/1971 Dehmelt ................ G01R 33/26
                                                        324/304

(Continued)

FOREIGN PATENT DOCUMENTS

| EP | 0 462 002 A1 | 12/1991 |
| EP | 0 579 537 A1 | 1/1994 |
| EP | 0 964 260 A1 | 12/1999 |

OTHER PUBLICATIONS

U.S. Appl. No. 14/324,379, filed Jul. 7, 2014, Le Prado, et al.
(Continued)

*Primary Examiner* — Susan Lee
(74) *Attorney, Agent, or Firm* — Oblon, McClelland, Maier & Neustadt, L.L.P.

(57) ABSTRACT

A magnetic resonance optical pumping isotropic magnetometer including a laser, a gas filled cell, a HF discharge circuit, RF magnetic field generating coils surrounding the cell, a first frequency regulating mechanism of an RF generator, a second polarization regulating mechanism of the laser beam, and a third regulating mechanism of the direction of the RF magnetic field. The direction of polarization of the laser beam at an inlet of the cell is orthogonally aligned with the (Continued)

magnetic field to be measured by virtue of a liquid crystal polarization rotator. The magnetometer is well-adapted to an integrated arrangement.

12 Claims, 8 Drawing Sheets

(58) Field of Classification Search
USPC .......................................................... 324/304
See application file for complete search history.

(56) References Cited

U.S. PATENT DOCUMENTS

| | | | | |
|---|---|---|---|---|
| 3,641,426 | A * | 2/1972 | Brun | G01R 33/26 324/304 |
| 4,814,707 | A * | 3/1989 | Marton | G01R 33/26 324/304 |
| 5,225,778 | A | 7/1993 | Chaillout et al. | |
| 5,357,199 | A | 10/1994 | Leger et al. | |
| 6,313,628 | B1 | 11/2001 | Leger | |
| 2010/0289491 | A1* | 11/2010 | Budker | G01R 33/26 324/304 |
| 2012/0062221 | A1* | 3/2012 | Le Prado | G01R 33/26 324/244 |

OTHER PUBLICATIONS

International Search Report issued Apr. 5, 2013, in PCT/EP12/075426 filed Dec. 13, 2012.

Moreno, et al., "Two-dimensional polarization rotator using a twisted-nematic liquid-crystal display", Applied Optics, vol. 46, No. 6, XP-001504658, Feb. 20, 2007, pp. 881-887.

* cited by examiner

ISOTROPIC AND INTEGRATED OPTICAL PUMPING MAGNETOMETER

TECHNICAL FIELD

The present invention relates to the field of optical pumping magnetometers.

STATE OF PRIOR ART

Optical pumping magnetometers have been known for some decades. They are based on magnetic resonance between Zeeman lines, which is amplified using an optical pumping. For example in a magnetometer of this type using an helium ($^4$He) cell, helium atoms at the level $1^1S_0$ are excited at the metastable level $2^3S_1$ by means of an HF discharge. This metastable level $2^3S_1$ is divided into a Zeeman triplet in the presence of a static magnetic field. The atoms of the $2^3S_1$ are optically pumped to the level $2^3P_0$ using a tunable laser. As a result, there is a different depletion of the different lines of the triplet, through selective excitation at the level $2^3P_0$. Thus excited atoms come back through spontaneous emission to the metastable level $2^3S_1$. A magnetic resonance is induced between the levels of the triplet by means of an RF field at the Larmor frequency. The amplitude of the resonance signal is amplified by the optical pumping. The resonance is observed by means of an absorption peak at the outlet of the cell. In practice, the RF field generator is regulated in frequency to the absorption peak by means of a PLL loop, and the module of the magnetic field is directly deduced from the resonance frequency F from the Larmon relationship $B_0=(2\pi/\gamma)F$ where $\gamma$ is the gyromagnetic coefficient of the electron. Such a magnetometer measuring the module of the magnetic field is further called scalar magnetometer in the literature.

A detailed description of an optical pumping magnetometer will be found in Application EP-A-579 537. Such a magnetometer is illustrated in FIG. 1.

It comprises a cell 10 filled with helium, a laser 14 emitting a beam 15, at a wavelength tuned to the energy difference between the levels $2^3P_0$ and $2^3S_1$ of $^4$He, a polarizer 16 having a rectilinear polarization P, a photodetector 24 receiving the beam 18 that passed through the cell, a frequency regulation controlling an RF frequency generator 22, a frequency estimator 26 and an HF discharge circuit 30.

The discharge circuit 30 switches helium atoms from the ground level $1^1S_0$ to the metastable level $2^3S_1$ by means of a high frequency electrostatic discharge between two electrodes placed on the cell.

The RF frequency generator feeds a current to the two coils $56_1$ and $56_2$, having orthogonal axes, surrounding the cell 10 so as to generate a radiofrequency magnetic field within the latter. The axes of both coils and the direction of propagation of the beam form a rectangular trihedron. The RF magnetic field generated by the coils induces a resonance between the levels of the Zeeman triplet.

The magnetometer comprises a first frequency regulating circuit, 20 (to the Larmor frequency), a second regulating circuit 40, controlling the direction of polarization of the polarizer 16 and a third regulating circuit 50 controlling the direction of the radiofrequency magnetic field. The frequency regulation of the magnetometer can be performed from the DC component $LA_0$ of the signal $\Lambda$ at the outlet of the photodetector or from the component $LA_2$ (as shown in FIG. 1), at a frequency twice the Larmor Frequency.

More precisely, the second regulating circuit 40 controls a motor 46 adjusting the angular position $\phi$ of the polarizer 16 and thus the direction of polarization P so as to obtain the maximum amplitude of the resonance signal. It can be shown that if $\theta$ is the angle between the direction of polarization and that of the ambient magnetic field, $B_0$, the DC component $LA_0$ of the signal $\Lambda$ at the outlet of the photodetector varies as $(3\cos^2\theta-1)^2$. It is thus of maximum amplitude for $\theta=0°$ and $\theta=90°$. Generally, the value $\theta=0°$ cannot be reached by varying the angular position of the polarizer (it can only be if $B_0$ is located in the plane of the polarizer). On the contrary, the value $\theta=90°$ can always be reached for a value $\phi_{max}$ of the angular position of the polarizer. The component $LA_1^Q$ of the signal $\Lambda$ in phase quadrature with the radiofrequency signal is cancelled for $\theta=90°$ and acts as an error signal to the regulating circuit 40. This circuit therefore regulates the angular position of the polarizer to the value $\phi_{max}$.

The third regulating circuit 50 comprises a polarization angle detector 52 delivering two signals proportional to $\cos\phi$ and $\sin\phi$, as well as two multipliers $54_1$ and $54_2$ multiplying these two signals with the RF signal respectively. The signal produced feed the coils $56_1$ and $56_2$ respectively such that the RF magnetic field $B_{RF}$, has always the same direction as the polarization P of the beam.

The regulating circuits 40 and 50 thus keep permanently the orthogonality between the polarization P and the ambient magnetic field $B_0$, on the one hand and the alignment of the magnetic field $B_{RF}$ with the polarization P, on the other hand. In this configuration, the resonance detection conditions are optimum and do not depend on the relative orientation of the magnetometer with respect to the field $B_0$. For this reason, such a magnetometer is described as isotropic.

The use of a motor polarizer rotating in a magnetometer however has some drawbacks.

First, the motor has to be non-magnetic in that it must not disturb the ambient magnetic field, especially as the polarizer must be placed preferably in the proximity of the cell.

Then, the rotation of the motor generates micro-vibrations and optical coupling variations which can themselves disturb the measurement.

Finally, this mechanism is fragile and likely to get misadjusted over time (in particular optical misalignment). It is ill-adapted to an integration and a miniaturization.

The purpose of the invention is consequently to provide an isotropic optical pumping magnetometer, which does not have the abovementioned drawbacks and which is well-adapted to an integration, for example for an on-board or space application.

DISCLOSURE OF THE INVENTION

The present invention is defined by an optical pumping magnetometer comprising a cell filled with a gas, a laser source emitting a light beam, a photodetector receiving the beam that passed through the cell and providing an electric signal, a first and a second coils having orthogonal axes, surrounding the cell and fed by a radiofrequency generator to generate a radiofrequency magnetic field therein, first regulating means receiving said electric signal and suitable for regulating the frequency of the radiofrequency generator to the Larmor frequency, second regulating means suitable for keeping the direction of polarization of the beam at the inlet of the cell orthogonal to the magnetic field to be measured, third regulating means suitable for keeping the direction of the radiofrequency field identical to the direction of polarization, said magnetometer comprising a liquid crystal polarization rotator receiving the light beam and suitable for rotating the direction of polarization thereof, said polarization rotator being controlled by a control signal provided by the second regulating means.

Advantageously, the third regulating means receive said control signal, deduce therefrom a couple of trigonometric coefficients giving the angular position of said direction of polarization and feed the first and second coils with currents at the frequency of the radiofrequency generator and having respective amplitudes proportional to said coefficients.

Said trigonometric coefficients are typically provided by a memory containing calibration curves of the angle of rotation of the rotator as a function of said control signal for a plurality of operating temperatures.

Advantageously, the second regulating means perform a synchronous detection of the electric signal at the frequency of the radiofrequency generator and generates the control signal from the quadrature component of said electric signal at this frequency.

Preferably, the control signal is enabled by means of a logic gate by an enable signal, before it is applied to the polarization rotator, said enable signal being obtained by a comparison between an indicator and a predetermined threshold value, said indicator being selected from the module of the DC component of the electric signal and the module of the component of the same signal at a frequency twice the frequency of the frequency generator.

According to a first alternative embodiment, the polarization rotator comprises:
  a first quarter wave plate and a second quarter wave plate, the slow axis of the first quarter wave plate being coextensive with a fast axis of the second quarter wave plate and the fast axis of the first quarter wave plate being coextensive with the slow axis of the second quarter wave plate;
  a variable delay plate located between the first and second quarter wave plates and consisting of a liquid crystal cell the bisectrix of the neutral axes thereof is coextensive with a neutral axis of the first quarter wave plate and the neutral axis of the second quarter wave plate.

According to a second alternative embodiment, the polarization rotator comprises:
  a first quarter wave plate and a second quarter wave plate (330), the slow axis of the first quarter wave plate being coextensive with the fast axis of the second quarter wave plate and the fast axis of the first quarter wave plate being coextensive with the slow axis of the second quarter wave plate;
  a delay plate located between the first and second quarter wave plates and consisting of a liquid crystal cell;
  a polarizer upstream of the first quarter wave plate in the direction of propagation of said beam, the polarizer polarizing said beam along a direction being a bisectrix of the neutral axes of the first quarter wave plate.

According to a third alternative embodiment, the polarization rotator comprises:
  a quarter wave plate having neutral axes;
  a delay plate located upstream of the quarter wave plate in the direction of propagation of the beam, consisting of a liquid crystal cell, and the bisectrix of the neutral axes thereof is coextensive with a neutral axis of the quarter wave plate, the beam at the inlet of the polarization rotator being polarized along a bisecting direction of the neutral axes of the delay plate.

The magnetometer is advantageously made in an integrated way, the laser being then a vertical cavity laser diode emitting through the surface, the polarization rotator being directly provided on said surface of the laser diode, and the gas filled cell being provided on the outlet face of the polarization rotator.

In this case, the first quarter wave plate can be provided on said surface of the laser diode and the gas filled cell is provided on the second quarter wave plate, the liquid crystal cell is sandwiched between the first and second quarter wave plates.

DETAILED DISCLOSURE OF PARTICULAR EMBODIMENTS

The basic principle of the invention is to use a liquid crystal polarization rotator in place of the motor polarizer of prior art.

Generally, a polarization rotator enables the direction of polarization of a rectilinearly polarized wave to be rotated.

A liquid crystal polarization rotator does not include a movable mechanical element and has a low magnetic signature (in that it scarcely disturbs the ambient magnetic field). It is also likely to be able to be integrated in a compact structure as will be seen later.

Figure 2:
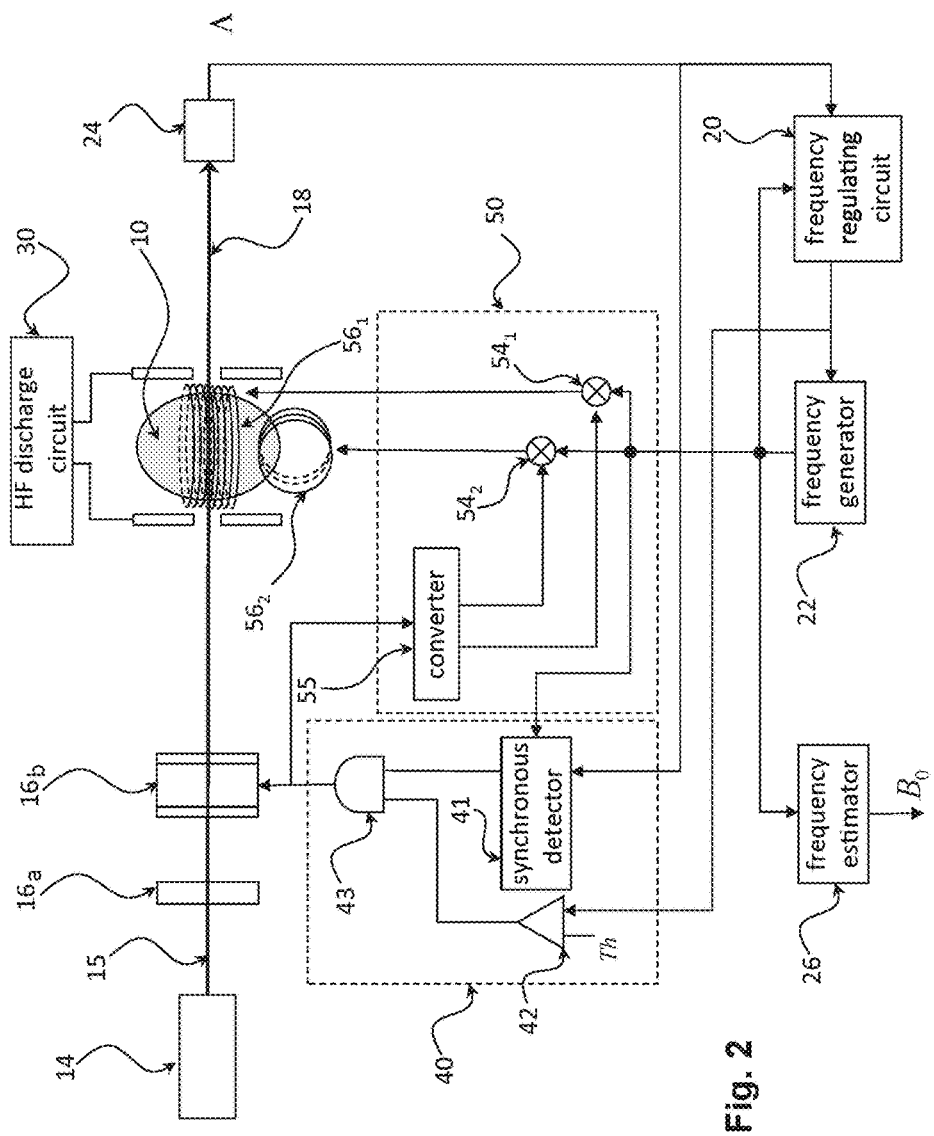
FIG. 2 schematically represents an optical pumping magnetometer according to an embodiment of the invention.

FIG. 2 represents an optical pumping magnetometer according to an embodiment of the invention.

Figure 1:
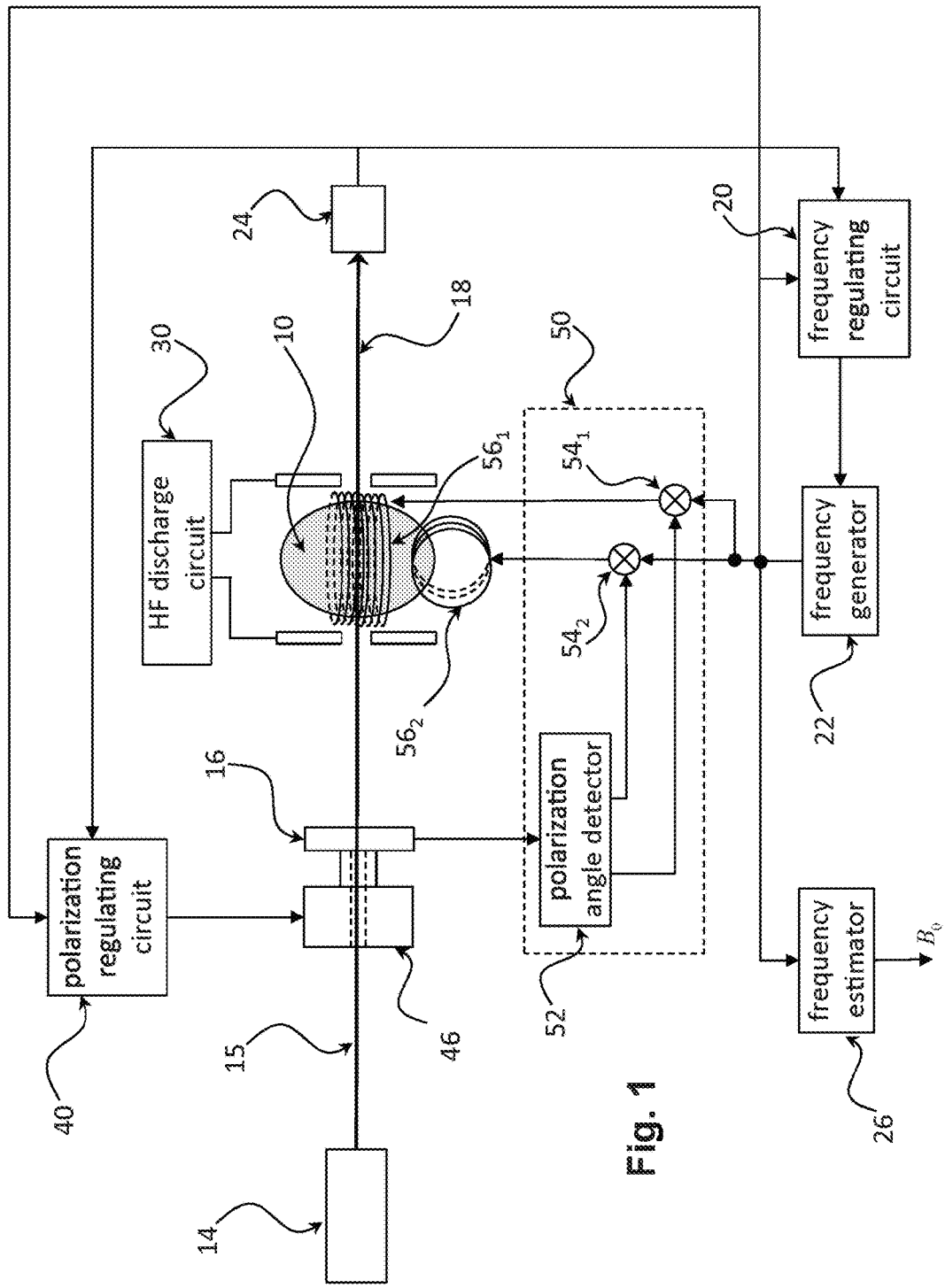
FIG. 1 schematically represents an optical pumping magnetometer known to the state of the art.

The principle of the measurement of the magnetic field module is the same as set out in connection with FIG. 1. Identical or similar elements to those of FIG. 1 bear the same reference numerals.

More precisely, the magnetometer in FIG. 2 comprises a laser 14, an optional rectilinear polarizer 16a, a liquid crystal polarization rotator 16b, a cell 10 filled with a gas, generally helium or an alkaline gas, a photodetector 24 receiving the beam 18 that passed through the cell, a first frequency regulating circuit 20 controlling an RF frequency generator 22, a frequency estimator 26 and a HF discharge circuit 30. The RF frequency generator feeds a current to two coils $56_1$ and $56_2$, having orthogonal axes, surrounding the cell 10, as previously. The axes of both coils and the direction of propagation of the beam form rectangular trihedron.

The magnetometer further comprises a second regulating circuit 40 controlling the rotation of polarization of the rotator 16b and a third regulating circuit 50 controlling the direction of the radiofrequency magnetic field.

The second regulating circuit 40 receives the signal Λ from the photodetector and performs, by means of the module 41, a synchronous detection at the RF frequency provided by the frequency synthesizer 22. The phase quadrature component at this frequency, noted $LA_1^Q$, acts as an error signal to control the control voltage of the polarization rotator. This quadrature component varies as $\sin 2\theta(3\cos^2\theta-1)$ and is consequently cancelled when the angle between P and $B_0$ is either 0°, 90°, or about 54° ($\cos\theta=1/\sqrt{3}$), where P is the direction of polarization of the beam at the outlet of the rotator. To prevent the regulation from remaining on the angular values 0° and 54°, in addition to $LA_1^Q$, the DC component $LA_0$ or the component at the second harmonic of the RF frequency, $LA_2$ is advantageously used. Indeed, the modules of the components $LA_0$ and $LA_2$ have a maximum for $\theta=90°$ and are cancelled for $\theta=0°$ and $\theta=54°$. Regardless of the component used, its intensity is compared to a threshold value Th in a comparator 42. If the intensity of the component $LA_0$ (or $LA_2$) is higher than this threshold, the comparator enables the error signal LAP by means of the logic gate 43. When enabled, the error signal controls the voltage applied to the polarization rotator 16b such that the direction of polarization of the beam at the outlet be oriented along the angle $\phi_{max}$, that is be orthogonal to $B_0$. This comparison with a threshold value can only be performed upon switching on the magnetometer, for the polarization to remain on the value $\theta=90°$. If the field changes its direction thereafter, the polarization remains regulated to this value.

The voltage from the error signal $LA_1^Q$ is also transmitted to a converting module 55 of the third regulating circuit 50. This converting module provides signals proportional to $\cos\phi$ and $\sin\phi$ from the voltage value in question. It will be noted that $\phi=\phi_0+\psi$ where $\psi$ is the polarization angle of rotation and $\phi_0$ is the angle to be imposed when the voltage is zero to keep the alignment between the magnetic field $B_{RF}$ and the direction of polarization P. To do this, it for example comprises a memory (look-up table) wherein are stored calibration curves of the polarization angle of rotation as a function of the voltage applied to the polarization rotator. These calibration curves relate to different operating temperatures. For a given temperature and an applied voltage value, the memory provides a couple of values proportional to $\cos\phi$ and $\sin\phi$ (or only the angle $\phi$, the trigonometric calculation being made outside). These trigonometric values are multiplied by means of the multipliers $54_1$ and $54_2$ with the RF signal from the frequency synthesizer 26. The signals from the multipliers $54_1$ and $54_2$ feed a current to the induction coils $56_1$ and $56_2$ respectively. Thus, the magnetic field $B_{RF}$ generated in the cell is substantially parallel to the polarization of the beam at the outlet of the rotator.

The polarizer 16a at the inlet of the polarization rotator 16b will be dispensed with if the beam emitted by the laser 14 already has a rectilinear polarization or a high extinction ratio (compatible with the maximum percent ellipticity acceptable for a magnetometer). Generally, the direction of polarization at the inlet of the rotator can be any direction. However, as will be seen later, for some types of rotators, the direction of polarizations at the inlet of the rotator can be set by the latter.

The frequency synthesizer (or the voltage controlled oscillator) 22 is driven by the frequency regulating circuit 20. This uses an error signal generated by a synchronous detection module. This module performs a synchronous detection of the signal $\Lambda$ from the photodetector at a reference frequency and outputs either the DC component $LA_0$ or the module of resonance signal $LA_2$ twice the Larmor frequency. The frequency regulation can be equally achieved from either of these components. At resonance, the RF frequency, F is set to the Larmor frequency $$f_{Larmor}=\frac{\gamma}{2\pi}B_0.$$

The intensity of the ambient magnetic field, $B_0$, is given, to the closest gyromagnetic coefficient, by a frequency estimator 26 directly estimating the frequency F of the signal at the outlet of the synthesizer 22 or even, indirectly, from the control signal of the latter.

Finally, the magnetometer could include laser wavelength regulating means, in a known manner per se.

Figure 3A:
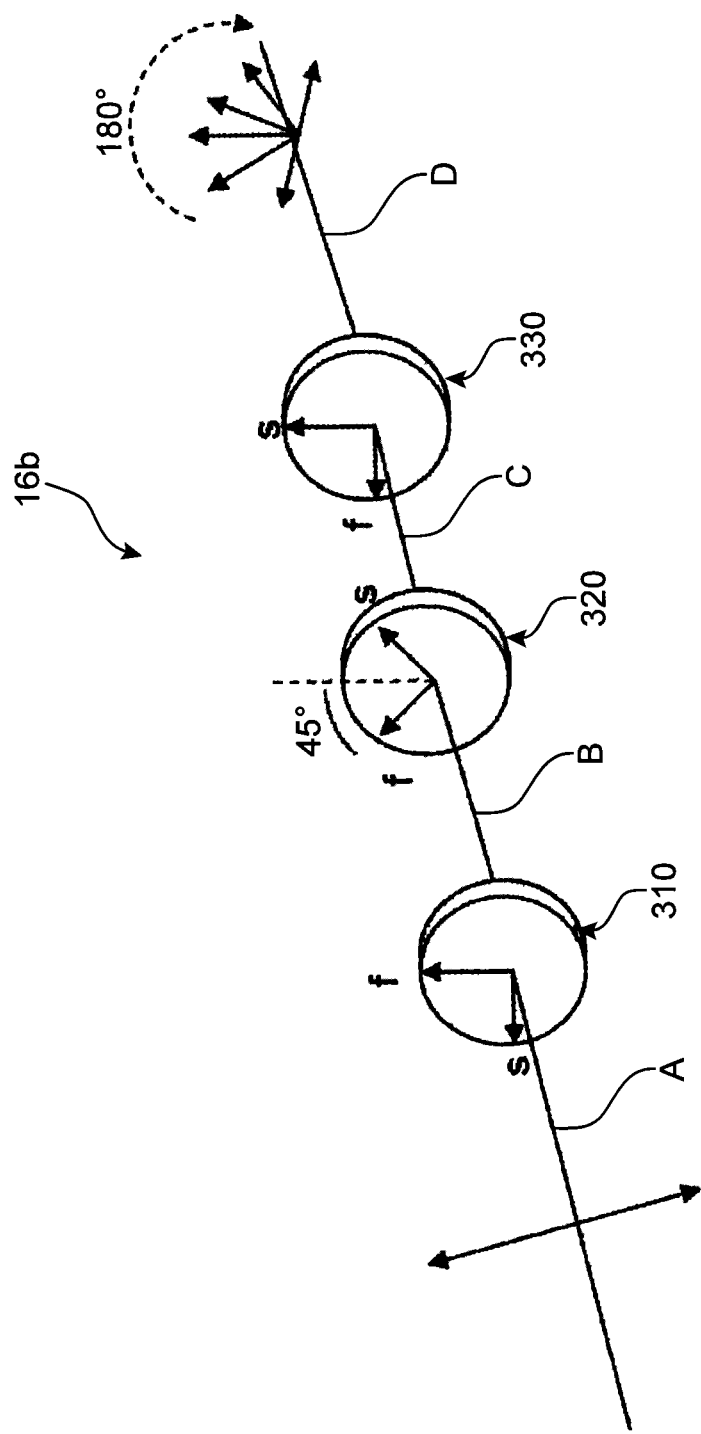
FIG. 3A represents an exemplary embodiment of a polarization rotator used in the magnetometer of FIG. 2.

FIG. 3A represents a first exemplary polarization rotator 16b that can be used in an optical pumping magnetometer according to the invention.

The polarization rotator comprises a first quarter wave plate 310, a liquid crystal variable delay plate 320 and a second quarter wave plate 330. These different elements are made of a birefringent material and for each element, s designates the slow axis and f the fast axis. The fast axis of the second quarter wave plate is coextensive with the slow axis of the first one and the slow axis of the second quarter wave plate is coextensive with the fast axis of the first one. The bisectrix of the neutral lines (that is the slow and fast axes) also called neutral axes hereinafter) of the variable delay plate is oriented so as to be aligned with a neutral axis of the first and second quarter wave plates. In practice, the alignment between both quarter wave plates, on the one hand, and between each of the quarter wave plates and the variable delay plate, on the other hand, should be performed to the closest degree.

It is reminded that in normal incidence, a quarter wave plate transforms an incident wave having a rectilinear polarization into a wave having an elliptic polarization the axes of which are the neutral axes of this plate.

Because of its bisecting orientation, the variable delay plate modifies the ellipticity of this polarization without modifying the direction of its own axes.

The second quarter wave plate transforms the elliptically polarized wave from the delay plate 320 into a rectilinearly polarized outlet wave since the own axes of polarization are coextensive with its neutral axes.

Thus, the outlet wave has a rectilinear polarization oriented along a direction rotated with respect to the direction of polarization of the incident wave.

Figure 3B:
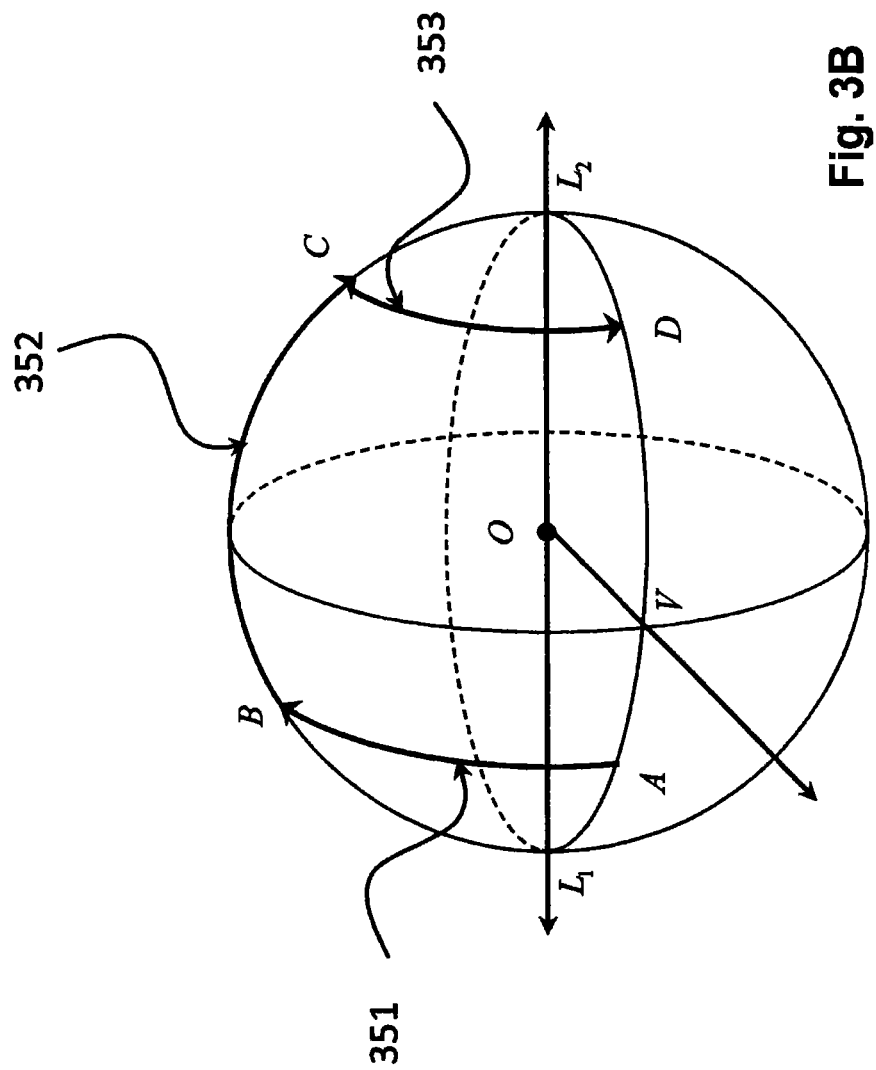
FIG. 3B illustrates the principle of the polarization rotator of FIG. 3A on the Poincare sphere.

The principle of the polarization rotator will be better understood using the Poincare sphere illustrated in FIG. 3B.

It is reminded that the equator of the Poincare sphere represents the rectilinear polarizations and the poles represent the circular polarizations (right and left). All the other points of the sphere correspond to elliptic polarizations. When a meridian of the sphere is travelled, the own axes of the polarization remain unchanged, only ellipticy varies.

The effect of the birefringent element onto the polarization translated on the Poincare sphere by a rotation about an axis connecting two diametrically opposed points of the sphere, each representing a rectilinear polarization along the neutral line (or neutral axis) of the element in question. The axis of rotation is noted $OL_1$ for the first quarter wave plate, OV for the variable delay plate and $OL_2$ for the second quarter wave plate. It will be noted that, because of the orientation of the delay plate in FIG. 3A, the straight line OV is orthogonal to the straight line $L_2L_2$.

The polarization of the incident wave has been represented by the point A on the sphere. This polarization can be here of any direction (point A is located in any point of the equator). Point B corresponds to the polarization at the outlet of the first quarter wave plate. It is deduced from A by a rotation about the axis $OL_1$ (arc of circle 351). Point C corresponds to the polarization at the outlet of the variable delay plate 320. It is deduced from point B by a rotation about the axis OV (arc of circle 352). The angle of rotation (or the length of the arc of meridian) is a function of the delay introduced by the plate 320. Finally, point D corresponds to the polarization at the outlet of the second quarter wave plate. It is deduced from point C by a rotation about the axis $OL_2$. It will be noted that the angle between the straight lines OA and OD is equal to twice the angle of rotation α of the polarization induced by the rotator.

The variable delay plate consists of a nematic liquid crystal cell with homogenous (cell at the ON state at rest) or homeotropic (cell at the OFF state at rest) anchoring, with the convention that at OFF state, the liquid crystal cell does not perform a polarization rotation.

The liquid crystal is advantageously a non-magnetic nematic liquid crystal. To that end, the liquid crystal marketed by the Merck™ company as MLC2062 could be used. This liquid crystal is further characterised by a strong birefringence and a low viscosity. Alternatively, the liquid crystal marketed by the DIC company as 9BD-25 could be used.

Generally, the selection of the liquid crystal will result from a compromise between thickness, birefringence (deviation between the fast index and slow index of the liquid crystal) and response time, as explained hereinafter.

The delay induced by the delay plate, and thus the polarization rotation, is a function of the voltage applied to the liquid crystal cell, the thickness of this layer and the operating temperature.

The maximum angle of polarization is proportional to the thickness of the liquid crystal layer. To obtain an isotropic magnetometer, it is necessary that this maximum angle is at least 180°. Thus, one is sure that the polarization P can be made orthogonal to $B_0$.

In practice, the thickness of the liquid crystal layer can result from a compromise between the maximum angle of polarization rotation and its response time. Indeed, the response time of the liquid crystal layer (and thus the magnetometer) is proportional to the square of its thickness. By way of example, the thickness of the liquid crystal layer will be between 5 μm and 10 μm for MLC2062.

The liquid crystal birefringence depends on the operating temperature. At each operating temperature corresponds a calibration curve giving the polarization angle of rotation as a function of the voltage applied.

Figure 3C:
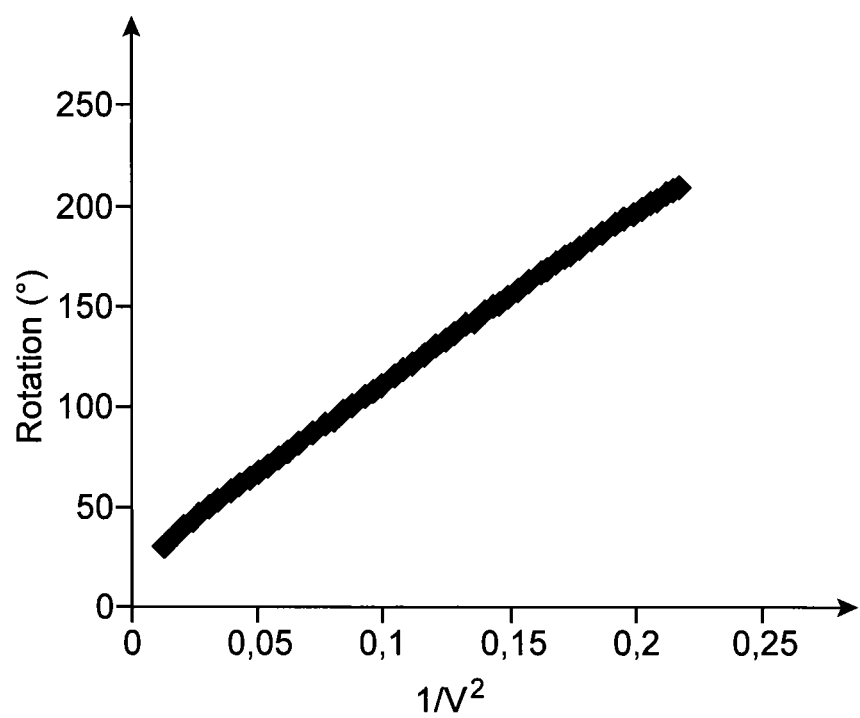
FIG. 3C represents an exemplary calibration curve for the polarization rotator of FIG. 3A.

FIG. 3C gives an exemplary calibration curve for a liquid crystal cell MLC2062 of 10 μm thickness at a temperature of 20° C.

It is observed that the polarization rotation is, as a first approximation, inversely proportional to the square of the voltage applied. At each temperature corresponds a different proportionality coefficient. The polarization rotator is calibrated for an operating temperature range from for example 10° C. to 50° C., each calibration curve (or each proportionality coefficient) acting to calculate data stored in the memory of the conversion module 55.

Figure 4:
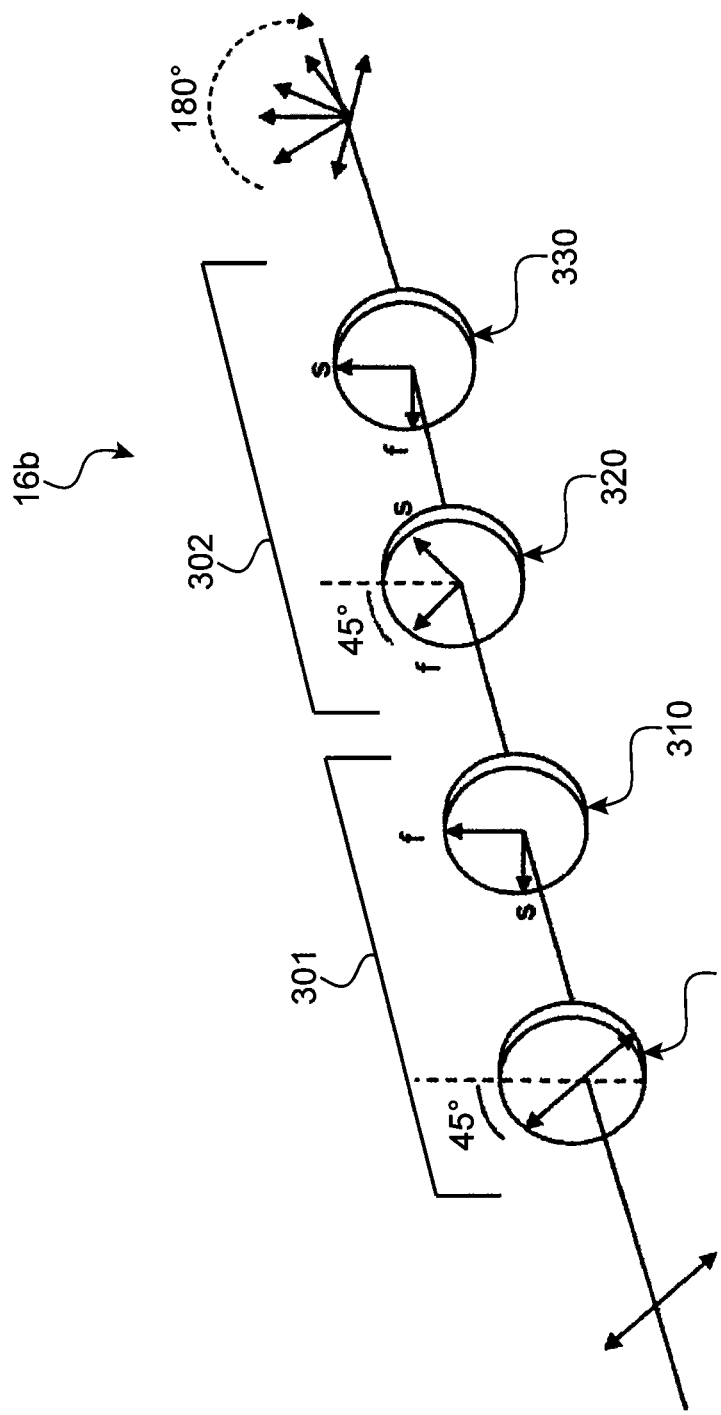
FIG. 4 represents a second exemplary embodiment of the polarization rotator used in the magnetometer of FIG. 2.

FIG. 4 represents a second exemplary embodiment of the polarization rotator that can be used in an optical pumping magnetometer according to the invention.

This rotator is differentiated from that of FIG. 3 by the presence of an inlet polarizer 305 upstream of the first quarter wave plate 310. It is assumed that the incident wave has a rectilinear polarization coextensive with that of the polarizer 305. For example, the laser 14 directly provides a linearly polarized wave in this direction and the polarizer 16*a* is absent.

The direction of polarization of the polarizer 305 is oriented such as to be coextensive with the bisectrix of the neutral axes of the first quarter wave plate. This configuration has two advantages. First, the polarization at the outlet of the first quarter wave plate is circular, thus the delay plate 320 can be oriented in any way with respect to the latter (its orientation with respect to the second quarter wave plate is however subjected to the same condition as previously). Then, the assembly consisting of the polarizer and the first quarter wave plate makes up an optical insulator: a reflection downstream of the first quarter wave plate (for example on the upstream face of the variable delay plate 320) is translated by a reflected circularly polarised wave propagating in the reverse direction of the incident wave, which reflected wave is transformed by this same plate into a rectilinear polarization wave having a direction of polarization orthogonal to that of the polarizer.

For the rest, the operation of the polarization rotator is identical to the previous one. It will be noted that on the Poincare sphere, point A is coextensive herein with point V and point B corresponds to the upper pole.

In this exemplary embodiment, the inlet polarizer 305 and the first quarter wave plate 310 form a first optical block, 301. Further, the variable delay plate 320 and the second quarter wave plate 330 form a second optical block, 302. By optical block, it is meant an assembly of optical elements the relative orientation of which about the common optical axis is fixed, for example by means of a mechanical connection between these elements.

It can be shown that such a rotator is robust towards a possible misalignment between elements of the first optical block (inlet polarizer and first quarter wave plate) as well as an misalignment between the first and second optical blocks (in other words between the neutral axes of the first and second quarter wave plates). More precisely, such an assembly with two optical blocks only introduces low ellipticity at the outlet of the polarization rotator: a rectilinearly polarised wave along the inlet direction of polarization is transformed into a rectilinearly polarised wave, rotated by an angle α.

The assembly with two optical blocks 301 and 302 does not require an accurate alignment on an optical bench (the alignment between both optical blocks is simply performed in situ) and thus particularly easy to implement.

Figure 5:
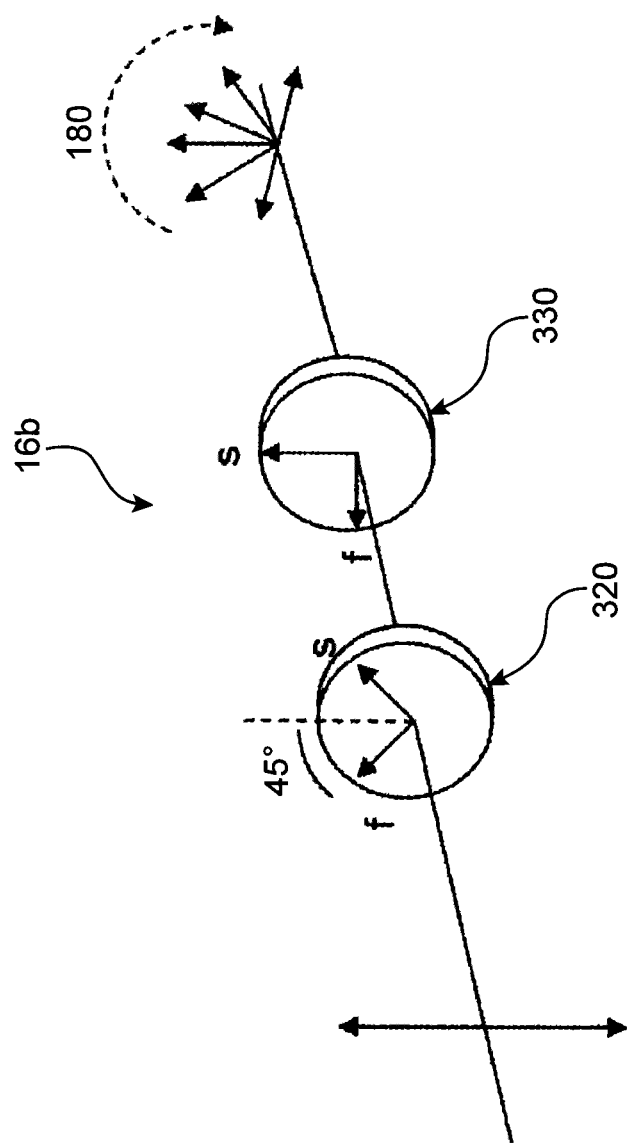
FIG. 5 represents a third exemplary embodiment of the polarization rotator used in the magnetometer of FIG. 2.

FIG. 5 represents a third exemplary embodiment of a polarization rotator usable in an optical pumping magnetometer according to the invention.

This polarization rotator has a simpler structure than both previous ones since the first quarter wave plate is removed. It is however assumed that the direction of polarization of the incident wave is coextensive with the bisectrix of the neutral axes of the delay plate (or with the orthogonal of this bisectrix). This condition can be achieved by rotating the rotator with respect to the beam (if it is already polarised) or by placing a suitably oriented polarizer 16*a*. In any case, and as previously, the bisectrix of the neutral axes of the delay plate is coextensive with a neutral axis of the outlet of the quarter wave plate.

Returning to the Poincare sphere of FIG. 3B, this simply amounts to considering the case where point A is coextensive with point $L_1$ (or $L_2$). It is understood that the first quarter wave plate is herein useless since the polarization of the incident wave would be coextensive with a neutral axis thereof. The delay plate leads the polarization to make an arc of circle on the meridian of the sphere and the quarter wave plate brings it back to the equator as previously.

It will be noted that the third exemplary embodiment of the polarization rotator does not provide optical insulation.

Figure 6:
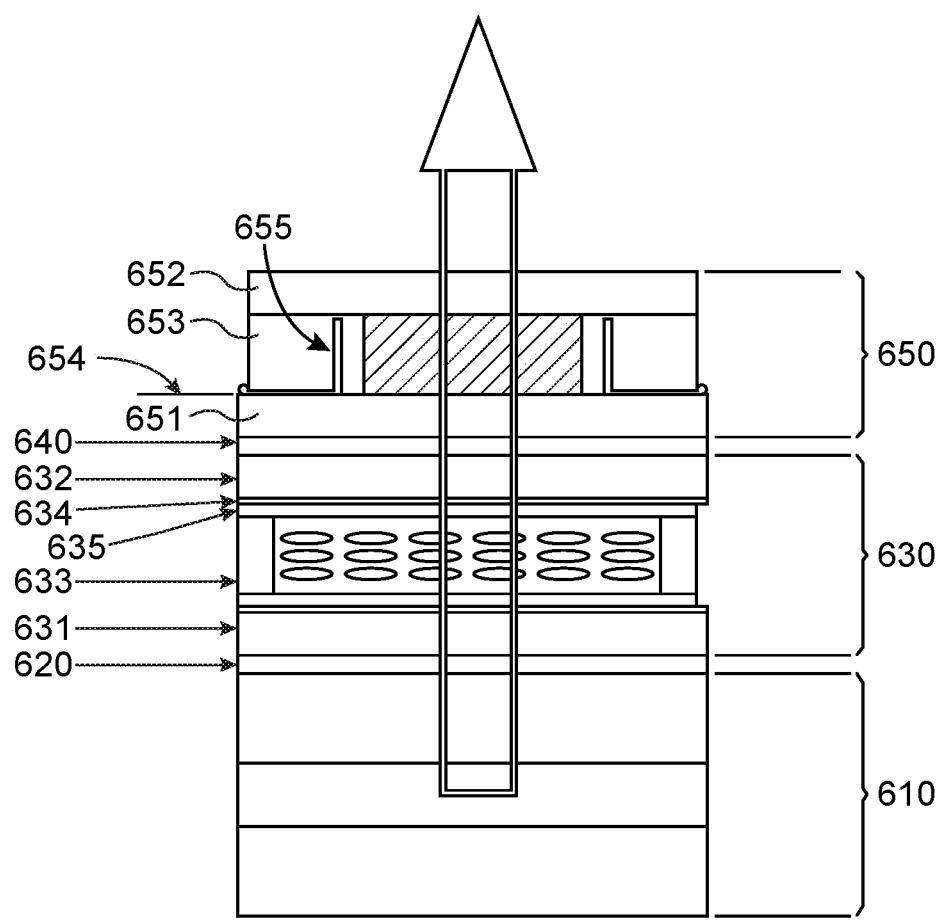
FIG. 6 represents an exemplary integrated embodiment of the magnetometer of FIG. 2.

FIG. 6 illustrates an exemplary optical pumping magnetometer according to the invention, made in an integrated way.

This magnetometer advantageously uses a vertical cavity laser diode emitting through the surface (VCSEL), 610, whereon the first quarter wave plate, 620, the liquid crystal cell 630, the second quarter wave plate, 640, and the gas cell, 650 are respectively provided.

The liquid crystal cell is sandwiched between the first and second quarter wave plates. It is vertically bounded by a first glass plate 631 and a second glass plate 632, and sideways by a gap (e.g. cylindrical), 633, of polymer. Thus bounded cavity is filled with a nematic liquid crystal. The nematic liquid crystal layer is a few micron thick. A conducting layer transparent to the laser wavelength (typically of ITO), 634, is deposited onto the upper surface of the first glass plate and on the lower surface of the second glass plate so as to be able to apply an electric voltage to the cell 630. An aligning layer, 635, for example of polyimide is provided on the high and low transparent conducting layers so as to align up the liquid crystal at rest.

The gas cell, 650, is particular bounded by a third glass plate 651 and a fourth glass plate 652, and sideways by a silicon gap 653. Thus bounded cavity is filled for example with helium $^4$He or an alkaline gas. Conducting leads 654 connected to the HF discharge circuit are provided to feed the electrodes 655 (located in vias of the silicon or on the cell wafer) diametrically opposed two by two with respect to the cavity axis.

Finally, two orthogonal coils, made as discrete elements (not shown), are provided about the cavity to generate the RF magnetic field.

It will be understood that the structure of the magnetometer is particularly compact and hardly susceptible of misalignment or mechanical deformation.

In practice, the materials used (ITO layers, polymide layer) have a negligible magnetic signature.

The polarization rotator signature is substantially due to the magnetic field created by the control signal of the liquid crystal cell. Indeed, in order to suppress the migration of impurities to the walls of the liquid crystal cell, the control signal is alternating and has a frequency in the order of 100 Hz to 10 kHz (the effective amplitude of the signal controls the polarization rotation) and the maximum intensity of the flow current is in the order of about ten μA.

In view of the orders of magnitude given above, the control signal signature of the liquid crystal cell is lower than about ten pT and thus substantially negligible towards $B_0$.

The integration of the magnetometer makes its manufacture compatible with a mass production, which enables a manufacturing cost thereof to be reduced by means of conventional microfabrication techniques of microelectronics.

The magnetometer described above is a scalar magnetometer in that, as said, it only enables the module $B_0$ of the ambient magnetic field $B_0$ to be measured. It is however possible to build a vector magnetometer from this scalar magnetometer, as described in the European application EP-A-964260. This vector magnetometer includes a further conducting winding, in other words, in total, three conducting windings surrounding the cell and the axes of which form a rectangular trihedron, each winding being excited with a signal having a distinct frequency, that is $F_x$ for the axis Ox, $F_y$ along the axis Oy and $F_z$ along the axis Oz, the currents in the three coils being controlled using regulating means. This measurement principle is identical to that given in the aforesaid application.

The invention claimed is:

1. An optical pumping magnetometer comprising:
    a cell filled with a gas;
    a laser source emitting a light beam;
    a photodetector receiving the light beam that has passed through the cell and providing an electric signal;
    first and second coils having orthogonal axes, surrounding the cell and fed by a radiofrequency generator to generate a radiofrequency magnetic field therein;
    first regulating means receiving the electric signal and configured to regulate a frequency of the radiofrequency generator to a Larmor frequency;
    second regulating means configured to keep a direction of polarization of the light beam at an inlet of the cell orthogonal to the magnetic field to be measured;
    third regulating means configured to keep a direction of the radiofrequency field identical to the direction of polarization; and
    a liquid crystal polarization rotator receiving the light beam and configured to rotate a direction of polarization thereof, the polarization rotator being controlled by a control signal provided by the second regulating means.

2. The optical pumping magnetometer according to claim 1, wherein the third regulating means receives the control signal, deduces therefrom a couple of trigonometric coefficients giving an angular position of the direction of polarization, and feeds the first and second coils with currents at the frequency of the radiofrequency generator and having respective amplitudes proportional to the coefficients.

3. The optical pumping magnetometer according to claim 2, wherein the trigonometric coefficients are provided by a memory including calibration curves of an angle of rotation of the rotator as a function of the control signal for a plurality of operating temperatures.

4. The optical pumping magnetometer according to claim 1, wherein the second regulating means performs a synchronous detection of the electric signal at the frequency of the radiofrequency generator and generates the control signal from a quadrature component of the electric signal at this frequency.

5. The optical pumping magnetometer according to claim 4, wherein the control signal is enabled by a logic gate by an enable signal, before the control signal is applied to the polarization rotator, the enable signal being obtained by a comparison between an indicator and a predetermined threshold value, the indicator being selected from a module of a DC component of the electric signal and a module of a component of the electric signal at a frequency twice the frequency of the frequency generator.

6. The optical pumping magnetometer according to claim 1, wherein the polarization rotator comprises:
    a first quarter wave plate and a second quarter wave plate, a slow axis of the first quarter wave plate being coextensive with a fast axis of the second quarter wave plate and a fast axis of the first quarter wave plate being coextensive with a slow axis of the second quarter wave plate;
    a variable delay plate located between the first and second quarter wave plates and including a liquid crystal cell with a bisectrix between its neutral axes coextensive with a neutral axis of the first quarter wave plate and a neutral axis of the second quarter wave plate.

7. The optical pumping magnetometer according to claim 1, wherein the polarization rotator comprises:
   a first quarter wave plate and a second quarter wave plate, a slow axis of the first quarter wave plate being coextensive with a fast axis of the second quarter wave plate and a fast axis of the first quarter wave plate being coextensive with a slow axis of the second quarter wave plate;
   a variable delay plate located between the first and second quarter wave plates and including a liquid crystal cell;
   a polarizer upstream of the first quarter wave plate in a direction of propagation of the beam, the polarizer polarizing the beam along a direction being a bisectrix of a neutral axes of the first quarter wave plate.

8. The optical pumping magnetometer according to claim 1, wherein the polarization rotator along a common optical axis comprises:
   a first optical block comprising a rectilinear polarizer and a first quarter wave plate, having a fixed orientation with respect to each other, a direction of polarization of the polarizer being a bisectrix of neutral axes of the quarter wave plate;
   a second optical block comprising a variable delay plate including a liquid crystal plate, and a second quarter wave plate, having a fixed orientation with respect to each other, neutral axes of the second quarter wave plate being bisectrix of neutral axes of the variable delay plate.

9. The polarization rotator according to claim 8, wherein a relative orientation of the first and second optical blocks about a common optical axis is adjustable, and adjusted such that the slow and fast axes of the first quarter wave plate are respectively coextensive with the fast and slow axes of the second quarter wave plate.

10. The optical pumping magnetometer according to claim 1, wherein the polarization rotator comprises:
    a quarter wave plate having neutral axes;
    a variable delay plate located upstream of the quarter wave plate in a direction of propagation of the beam, including a liquid crystal cell, and a bisectrix of which between its neutral axes is coextensive with a neutral axis of the quarter wave plate, a beam at an inlet of the polarization rotator being polarized along a bisecting direction of the neutral axes of the variable delay plate.

11. The magnetometer according to claim 1, made in an integrated way, the laser being a vertical cavity laser diode emitting through the surface, the polarization rotator being directly provided on the surface of the laser diode, and the gas filled cell being provided on an outlet face of the polarization rotator.

12. The magnetometer according to claim 11, wherein a first quarter wave plate is provided on a surface of the laser diode and the gas filled cell is provided on a second quarter wave plate, a liquid crystal cell is sandwiched between the first and second quarter wave plates.

* * * * *